United States Patent
Leduc et al.

(10) Patent No.: US 10,670,666 B2
(45) Date of Patent: Jun. 2, 2020

(54) DETECTION OF DISTURBANCES OF A POWER SUPPLY

(71) Applicant: STMicroelectronics (Alps) SAS, Grenoble (FR)

(72) Inventors: Bruno Leduc, Voiron (FR); Pascal Bernon, Grenoble (FR); Stephane Clin, Sassenage (FR)

(73) Assignee: STMICROELECTRONICS (ALPS) SAS, Grenoble (FR)

( * ) Notice: Subject to any disclaimer, the term of this patent is extended or adjusted under 35 U.S.C. 154(b) by 119 days.

(21) Appl. No.: 16/047,743

(22) Filed: Jul. 27, 2018

(65) Prior Publication Data

US 2018/0335481 A1 Nov. 22, 2018

Related U.S. Application Data

(63) Continuation of application No. 15/076,955, filed on Mar. 22, 2016, now Pat. No. 10,067,200.

(30) Foreign Application Priority Data

Oct. 27, 2015 (FR) .................................... 15 60259

(51) Int. Cl.
*G01R 31/40* (2020.01)
*G01R 19/165* (2006.01)
*G01R 3/00* (2006.01)
*G01R 15/14* (2006.01)

(52) U.S. Cl.
CPC .............. *G01R 31/40* (2013.01); *G01R 3/00* (2013.01); *G01R 15/14* (2013.01); *G01R 19/165* (2013.01)

(58) Field of Classification Search
CPC ...... G01R 15/12; G01R 15/144; G01R 19/00; G01R 19/30; G01R 21/06; G01R 31/261; G01R 31/2623; G01R 31/40; G01R 31/42; G01R 15/14; G01R 3/00; G01R 17/00; G01R 19/165; G01R 19/16566; G01R 19/16504; H03K 5/1532; H03K 5/24; H03K 5/153; H03F 2203/45106; H03F 2203/45218; G05F 1/10; G05F 1/46; G05F 3/02; G11C 5/147
USPC ........ 324/76.11, 764.01; 327/50, 72, 77, 80, 327/321, 530
See application file for complete search history.

(56) References Cited

U.S. PATENT DOCUMENTS

| | | | |
|---|---|---|---|
| 4,163,909 A * | 8/1979 | Harr ..................... | H03K 5/1532 327/59 |
| 4,463,271 A | 7/1984 | Gill | |
| 4,833,341 A | 5/1989 | Watanabe et al. | |
| 5,027,006 A | 6/1991 | Queinnec et al. | |
| 5,384,505 A * | 1/1995 | Takahashi ............... | H03K 5/04 327/262 |

(Continued)

*Primary Examiner* — Tung X Nguyen
*Assistant Examiner* — Robert P Alejnikov, Jr.
(74) *Attorney, Agent, or Firm* — Slater Matsil, LLP

(57) ABSTRACT

A circuit includes, in series between a first terminal and a second terminal of application of a power supply voltage, and first and second branches. The first branch includes a first transistor and a first current source coupled to the first transistor. The second branch includes a resistive element, a second transistor coupled to the resistive element and forming a current mirror with the first transistor and a second current source coupled to the second transistor. The resistive element conditions a threshold of detection of a variation of the power supply voltage.

23 Claims, 4 Drawing Sheets

(56) References Cited

U.S. PATENT DOCUMENTS

| | | |
|---|---|---|
| 7,679,353 B2 | 3/2010 | Noda |
| 8,058,908 B2* | 11/2011 | Bae ..................... H03K 5/082 |
| | | 327/513 |
| 8,754,673 B1* | 6/2014 | Wang ................. H03K 5/2481 |
| | | 327/68 |
| 8,981,798 B2 | 3/2015 | Scuderi |
| 2005/0046438 A1* | 3/2005 | Tam ................. G01R 19/0023 |
| | | 324/76.11 |
| 2006/0125529 A1 | 6/2006 | Laulanet et al. |
| 2007/0013415 A1 | 1/2007 | Owen |
| 2007/0223168 A1* | 9/2007 | Vimercati ................ G05F 3/30 |
| | | 361/118 |
| 2012/0113737 A1 | 5/2012 | Lee et al. |
| 2014/0104005 A1* | 4/2014 | Zhang ................ H03K 3/0315 |
| | | 331/17 |
| 2014/0176098 A1* | 6/2014 | Fang ........................ G05F 1/46 |
| | | 323/280 |
| 2014/0312872 A1 | 10/2014 | Sato et al. |
| 2015/0286235 A1 | 10/2015 | Vahid Far et al. |

* cited by examiner

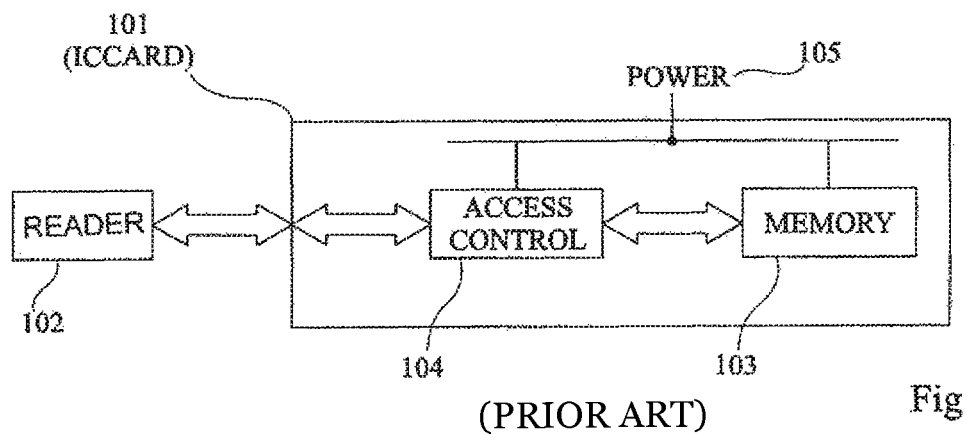
(PRIOR ART) Fig 1
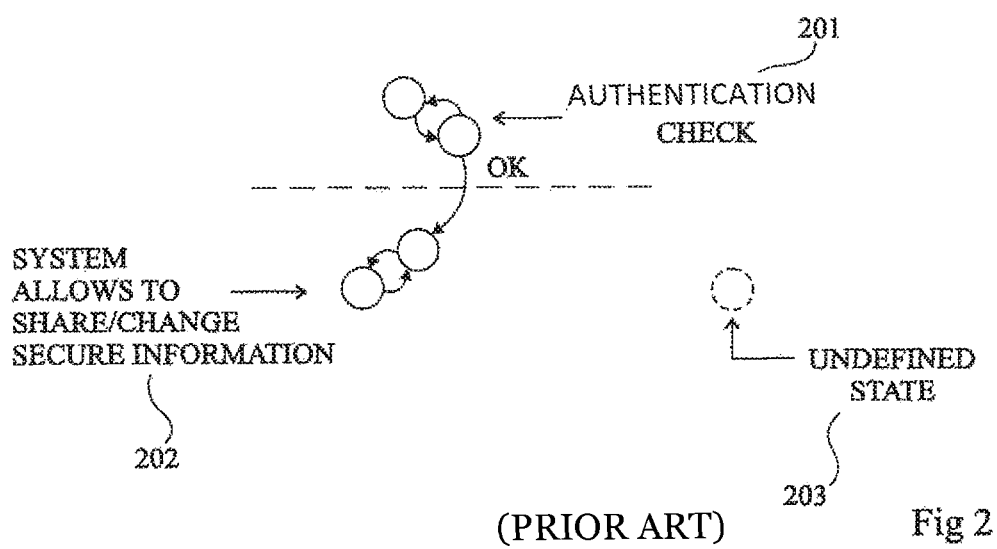
(PRIOR ART) Fig 2
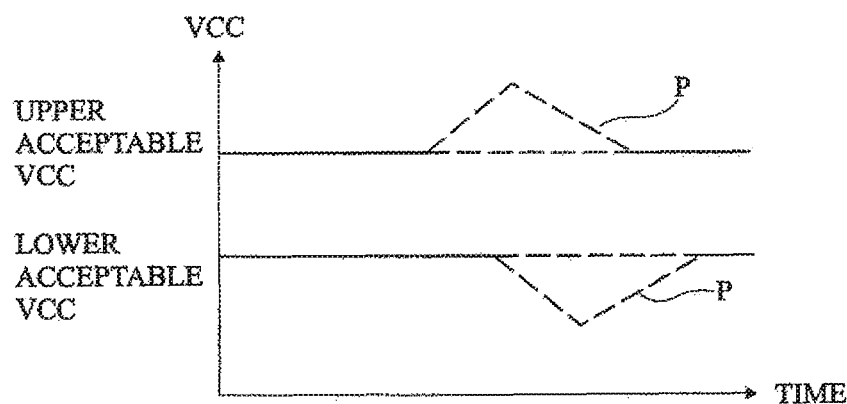
(PRIOR ART) Fig 3

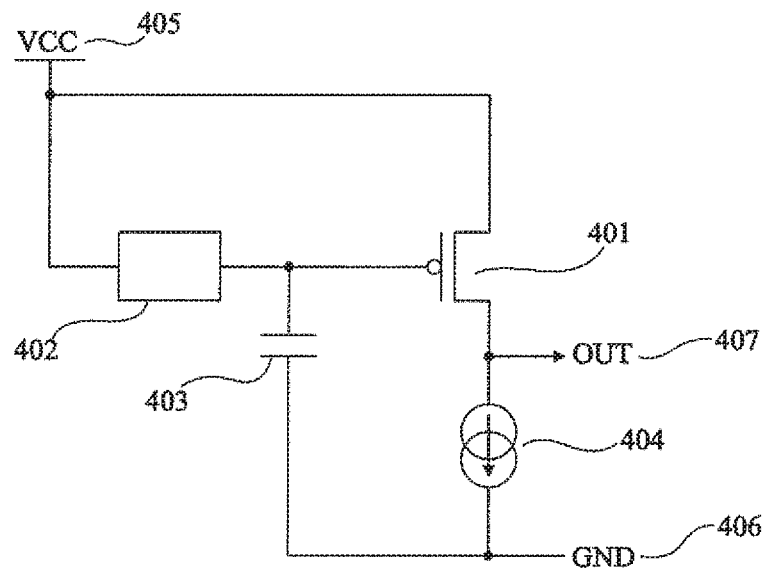
(PRIOR ART)   Fig 4
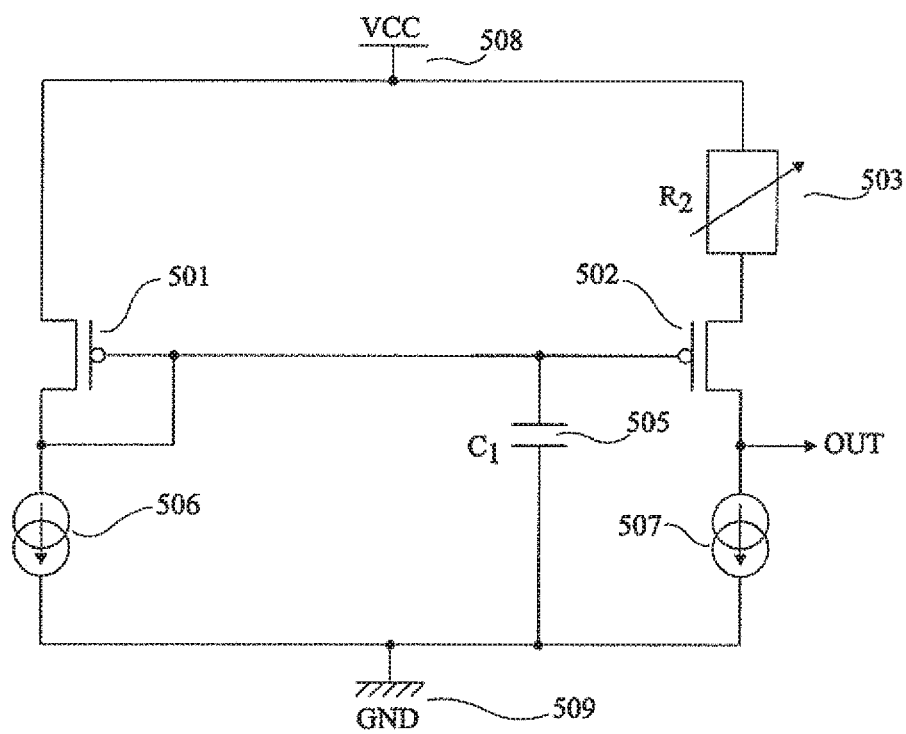
Fig 5

DETECTION OF DISTURBANCES OF A POWER SUPPLY

CROSS-REFERENCE TO RELATED APPLICATIONS

This application is a continuation of U.S. patent application Ser. No. 15/076,955 entitled "Detection of Disturbances of a Power Supply," filed Mar. 22, 2016, which application claims the benefit of French Application No. 1560259, filed on Oct. 27, 2015, which applications are hereby incorporated herein by reference.

TECHNICAL FIELD

The present invention generally relates to electronic circuits, and more particularly, to the detection of intentional or incidental disturbances of the normal operation of a circuit. A specific application is the detection of an attempt to access without authorization a secure electronic system, such as, for example, payment devices commonly called chip cards.

BACKGROUND

Secure chip cards, due to the information that they contain, arouse the interest of hackers, which have accordingly developed a number of ways to access the content of the cards. One of the known methods is fault injection. There thus is a need to improve the robustness of systems against attempts to disturb the operation thereof.

SUMMARY

An object is to improve existing circuits detecting intentional disturbances of a power supply voltage; decrease the threshold of detection of power supply disturbances; making the detection threshold independent from technological manufacturing variations; do away with temperature variations; and making the detection threshold programmable during the manufacturing of the circuit or during the use thereof.

One embodiment provides a circuit comprising, in series between a first power supply terminal and a second power supply terminal of application of a power supply voltage, a first branch comprising a first transistor and a first current source, and a second branch comprising a resistive element, a second transistor forming a current mirror with the first transistor, and a second current source. The resistive element may condition a threshold of detection of a variation of the power supply voltage.

The circuit may comprise a low-pass filter connected to the gates of the transistor s assembled as a current mirror. A low-pass filter may be connected between the first power supply terminal and the resistive element.

The first and second transistor s may comprise MOS transistor s. Alternatively, the first and second transistor s may comprise bipolar transistor s.

The first and second current sources may be formed with transistor s. A ratio of the dimensions of the first and second transistor s forming the current mirror and a ratio of the transistor s forming the first and second current sources may be different from 1.

A resistance of the resistive element may be programmable. The first and second current sources may be obtained from a voltage reference independent from temperature and from a resistor of the same type as the resistive element conditioning the detection threshold.

Another embodiment provides a device comprising a power supply regulator, a function powered by the regulator, and a circuit as defined above. The circuit may be powered by the regulator. The circuit may be powered upstream of the regulator.

BRIEF DESCRIPTION OF THE DRAWINGS

The foregoing and other features and advantages will be discussed in detail in the following non-limiting description of specific embodiments in connection with the accompanying drawings.

FIG. 1 shows a simplified view of a chip card and of a reader;

FIG. 2 shows a simplified view of different possible states of a chip card;

FIG. 3 shows an example of the shape of the power supply voltage of a circuit and illustrates an attack by injection of a power supply disturbance;

FIG. 4 shows an example of a circuit detecting a disturbance of the power supply voltage;

FIG. 5 shows an embodiment of a positive disturbance detection circuit;

DETAILED DESCRIPTION OF ILLUSTRATIVE EMBODIMENTS

Figure 6A:
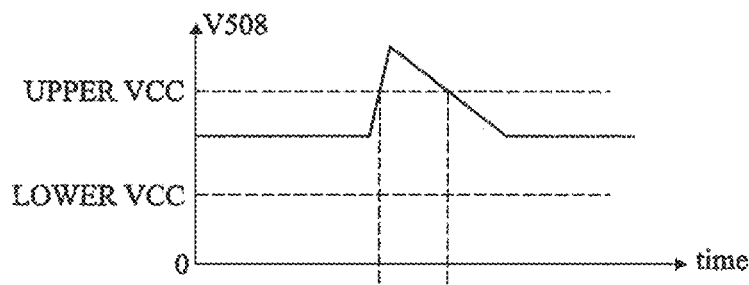
FIGS. 6A and 6B are timing diagrams illustrating an attack by disturbance of a power supply.

The same elements have been designated with the same reference numerals in the different drawings. For clarity, only those elements which are useful to the understanding of the described embodiments have been shown and are detailed. In particular, the applicative functions of the protected circuit have not been detailed. The described embodiments are compatible with usual applications.

Unless otherwise specified, expressions "approximately", "substantially", and "on the order of" mean to within 10%, and preferably to within 5%.

FIG. 1 schematically shows a chip card 101 (IC CARD) and a reader 102 (READER). A chip card generally comprises at least one memory element 103 (MEMORY) having the information stored therein, an element forming an external interface with the outside world 104, called an access controller (ACCESS CONTROL), and an element powering card 105 (POWER). The chip card may comprise additional elements.

FIG. 2 shows a simplified view of different possible states of a chip card. To access the information contained in the card 101 (FIG. 1), the latter should be presented to a card reader 102. The chip card then goes through an authentication process 201 (AUTHENTICATION CHECK) during which the access controller 104 checks whether a key provided by the reader during the communication protocol is in accordance with the key authorizing the memory access. If the condition is fulfilled, then access to the secure information of the card is authorized and the card transitions to an access authorization state 202 (SYSTEM ALLOWS TO SHARE/CHANGE SECURE INFORMATION). If the condition is not fulfilled, the access to the secure information is not allowed. It should be noted that the described process is simplified, and that similarly, there may exist other access control processes.

In a normal operating mode, a chip card is designed to transition through determined states to give or not give authorization to access the data stored in its memory 103. A known fault injection method comprises causing the setting to an undefined state 203 of the chip card (UNDEFINED STATE), enabling a hacker to access the secure information without going through the authentication phase.

FIG. 3 shows an example of the shape of the power supply voltage VCC of a circuit and illustrates an attack by injection of a power supply disturbance. To set a circuit to an undefined state 203 (FIG. 2), a disturbance is imposed outside of the power supply voltage range (UPPER ACCEPTABLE VCC/LOWER ACCEPTABLE VCC) for which the circuit is designed.

For the attack to be efficient, the disturbance should be sufficiently long to have an effect and sufficiently short to avoid turning off the circuit or damaging it. Similarly, the amplitude of the disturbance is selected to disturb the circuit without turning it off or damaging it. There thus is a need for protection against attempts to disturb the power supply voltages of devices containing secure information.

An attempt to disturb the electric power supply of the circuit contained in the chip card may be detected. The information is then provided to a system which applies countermeasures, for example, putting the card out of use, destroying the data, etc.

FIG. 4 shows an example of a circuit detecting a disturbance of the power supply voltage. The circuit comprises a resistor 402 and a capacitance 403 in series between a terminal 405 of application of a power supply voltage (VCC) and a grounding terminal 406 (GND), and a PMOS transistor 401. The gate of transistor 401 is coupled to the node common to resistor 402 and to capacitance 403, its source is coupled to power supply terminal 405, and its drain is coupled to a current source 404 having its other end connected to ground. An output 407 (OUT) of the circuit is sampled at the level of the transistor drain. The circuits for converting the level of the current crossing the transistor into a logic equivalent of value 0 or 1 according to whether the current is zero or non-zero is not shown.

When there is no power supply disturbance, PMOS transistor 401 is off, the current flowing therethrough is zero, and the output OUT is at a logic level 0. When a power supply disturbance occurs, voltage VCC (405) increases, which increases gate-source voltage VGS of the transistor. If voltage VGS is greater than a threshold voltage VT of the transistor, then the latter switches on and conducts a current. As a result, the output OUT switches states. A power supply disturbance has thus been detected.

A disadvantage of this circuit is that the amplitude of the disturbance should be greater than the voltage VT of the transistor in order to be detected. In other words, the threshold of detection of the power supply disturbance is greater than voltage VT.

To minimize or reduce electrical power consumptions and gain integration, the tendency is to go towards technologies withstanding lower and lower power supply voltages. Power supply voltages have been decreased on the order of 5 V to voltages of approximately 1.5 V, while at the same time, threshold voltage values VT have slightly decreased and are still on the order of 600-700 mV. This results in much lower power supply variations, below the levels of threshold voltages VT, which makes this type of detection system inoperative.

Indeed, if circuits allowing a 10% variation of the power supply voltage around a nominal value are designed, when passing from 5 V to 1.5 V, the power supply voltage varies from 500 mV to 150 mV. It can thus be seen that it is difficult to detect an attempt to detect a power supply disturbance based on a detection system using threshold voltages VT on the order of 700 mV. Advanced technologies provide transistor s with a low threshold voltage VT, but they are expensive and are not compatible with the economic criteria of the chip card market.

Another disadvantage is that the threshold voltages of the transistor s vary with technological manufacturing dispersions. Thus, the disturbance detection threshold also depends on dispersions, which induces disturbances within a population of manufactured circuits. As a result, there are strong detection threshold variations.

Another disadvantage is that this type of circuit does not enable making the threshold of detection of power supply disturbances adjustable. Another disadvantage is that this circuit does not detect power supply disturbances below the minimum power supply voltage threshold. Yet another disadvantage is that the detection threshold varies with temperature.

There thus is a need for a circuit detecting a positive or negative power supply disturbance (above the maximum tolerated voltage or under the minimum tolerated voltage), independently from the thresholds of MOS transistor s. Such a circuit is to have its detection threshold independent from manufacturing variations and from temperature variations, and have its threshold adjustable during the circuit production or in the final application.

FIG. 5 shows an embodiment of a positive disturbance detection circuit. The circuit comprises a MOS transistor 502 forming a current mirror with MOS transistor 501, with the two transistor s having their drains respectively coupled to two current sources 506 and 507. The other terminal s of the current source are coupled to a ground connection terminal 509 (GND). The circuit further comprises a capacitance 505 having one of its ends coupled to the gate of transistor s 501 and 502 and having its other end connected to terminal 509, as well as a variable resistor 503 having a terminal connected to the source of transistor 502 and having its other end coupled to terminal 508 of application of a power supply voltage (VCC). The source of transistor 501 is coupled to terminal 508. The output OUT of the circuit is sampled at the level of the drain of transistor 502.

Figure 6B:
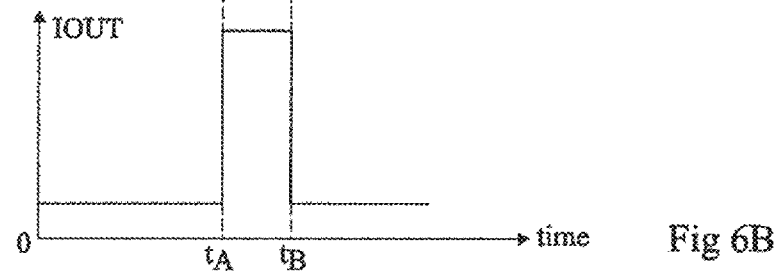

FIGS. 6A and 6B are timing diagrams respectively illustrating an example of the shape of power supply voltage 508 of the circuit and the corresponding current Iout crossing transistor 502 of the circuit of FIG. 5. FIG. 6A illustrates an example where a disturbance is applied between two times tA and tB. FIG. 6B illustrates current Iout, part of which originates from a bias current noted I0 and another part of which originates from the current induced by the disturbance.

The electrical assembly of FIG. 5 imposes: VGS2=VGS1−R2×I (equation 1), with:

VGS1 representing the voltage between gate G1 and source S1 of transistor 501;

VGS1 representing the voltage between gate G2 and source S2 of transistor 502; and R2 representing the value of resistor 503.

One may also write I=I0+iac; with iac representing the disturbance current.

When there is no power supply disturbance (iac=0), transistor 502 is biased by non-zero current I0 (FIG. 6B) due to diode-assembled transistor 501, it is thus in a quiescent mode. As a result, any potential variation of node 508 will instantaneously be seen by the transistor since the transistor is already biased to be conductive, conversely to what occurs in the case of FIG. 4.

Indeed, according to equation 1, if the potential of node VCC increases, the source of transistor 502 follows the voltage of node 508. In the case where resistance 503 is zero, since the transistor is already conductive in the quiescent state, there immediately is a current which adds to the quiescent current, and the state of the output OUT switches, which may be interpreted as switching from a logic level 0 to a logic level 1.

There thus now is a detection independent from voltage VT of MOS transistor 502 and the detection threshold is on the order of a few millivolts instead of being on the order of threshold VT of the MOS transistor.

In the case where resistance 503 is non-zero, if potential VCC increases, voltage VGS1 increases in absolute value due to the fact that the voltage of the source of transistor 501 increases with voltage VCC. At the same time, the potential of the source of transistor 502 increases, and voltage VGS2 also increases in absolute value.

As long as the amplitude of the disturbance is strictly smaller than R2×I, the level of voltage VGS2 is not sufficient for transistor 502 to induce a current additional to the bias current. The output OUT remains in its quiescent state.

When the amplitude of the disturbance is greater than or equal to R2×I, transistor 502 generates an additional current which adds to the bias current, and the output OUT changes value, which may be interpreted as a logic state switching.

A positive power supply disturbance detector has thus been formed, with its detection threshold being independent from threshold VT of the transistor s and its value being adjustable by resistor 503 and of the quiescent current flowing through transistor 502.

Transistor 501 is equivalent, as a first approximation in a small-signal model, to the inverse of its conductance gm, that is, to a resistor having value R1. Thus, the resistor and capacitance 505 of value C1 form a low-pass filter. By adjusting the value of this low-pass filter, the maximum frequency of the power supply disturbances detectable by the circuit can thus be defined.

When the potential of node 508 increases, the potentials of source S1 and of gate G1 also increase. If the frequency of the disturbance is smaller than $1/(2\pi R1C1)$, due to the action of the low-pass filter, the potential of gate G2 rises at the same time as that of gate G1. Since the potential of source S2 follows the potential of node 508, voltage VGS2 does not change since its potentials approximately vary by the same amplitude.

However, if the frequency of the disturbance is greater than $1/(2\pi R1C1)$, then, the variation of the potential of gate G2 is attenuated due to the filter with respect to the potential variation of gate G1. Thus, the potential of gate G2 does not increase as fast as that of source S2 which follows the potential of node 508, which induces a change in voltage VGS2. Capacitance 505, between the gate of transistor s 501 and 502 and ground 509, enables the frequency of the detected disturbances to be set.

Another embodiment which may be combined or not with the previous one, comprises making the value of the detection threshold programmable by way of a variable resistor, via a network of switched resistor s or any other equivalent approaches.

The transistor s 501 and 502 have equal dimension ratios W/L (W and L respectively being the width and the length of the gate of the transistor s) and the values of the currents flowing through current sources 506 and 507 are equal.

The current sources are designed with MOS transistor s, and the circuit is configured to have a dimension ratio W/L for transistor 502 and k×W/L for transistor 501, with k being different from 1. Similarly, a ratio W/L is provided for current source 506 and a ratio k×W/L is provided for current source 507. This configuration has the advantage of minimizing or reducing the power consumption in the branch of transistor 501 and of source 506. Other ratio configurations may exist.

The transistor s 501 and 502 may comprise bipolar transistor s instead of MOS transistor s. Similarly, the current ratios may be varied by having different emitter surface ratios between the two branches.

The current sources 506 and 507 are configured so that the reference current from which they derive is obtained by the ratio of a voltage independent from temperature (bandgap) to a resistance of the same type as resistance 503. The threshold of detection of power supply disturbances is independent from temperature variations is obtained.

Figure 7:
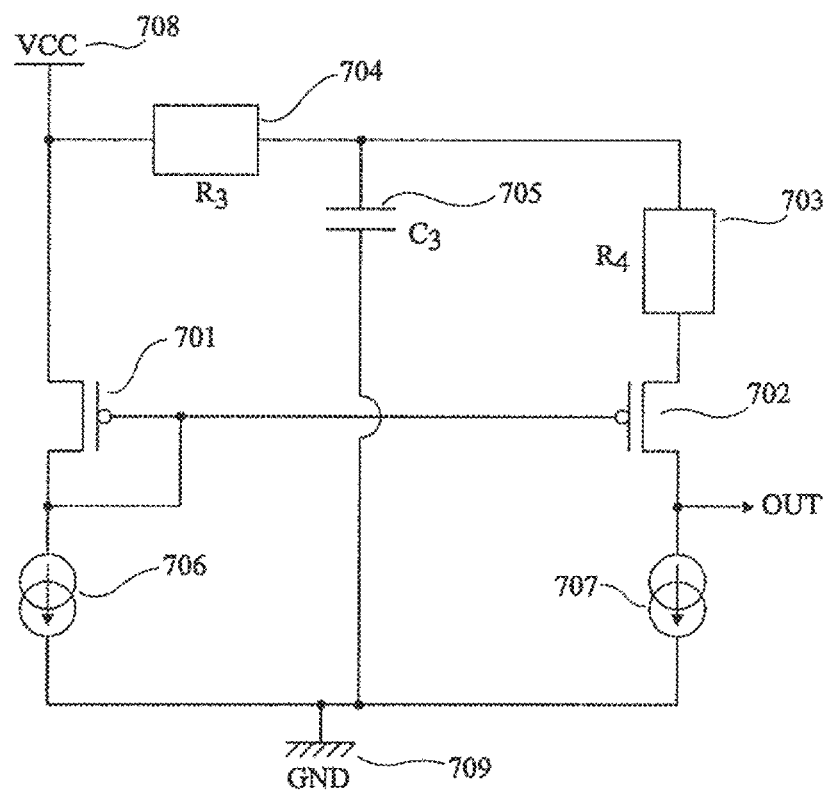
FIG. 7 shows an embodiment of a negative disturbance detection circuit.

FIG. 7 shows an embodiment of a negative disturbance detection circuit. The circuit comprises a resistor 704 and a capacitance 705, in series between a terminal 708 of application of a power supply voltage (VCC) and a grounding terminal 709 (GND). The circuit further comprises a MOS transistor 702 forming a current mirror with a MOS transistor 701, with the two transistor s having their drains respectively coupled to two current sources 706 and 707. The other terminal s of the current sources are coupled to ground 709. The source of transistor 701 is coupled to terminal 708 of application of a power supply potential, the source of transistor 702 is coupled to a terminal of a resistor 703, with the other terminal of this resistor being coupled to the node common to resistor 704 and to capacitance 705. The output OUT of the circuit is sampled at the level of the drain of transistor 702. The operation of this embodiment is similar to that of FIG. 5.

A detection of power supply disturbances having their threshold defined by value R4 of resistor 703 and by the quiescent current crossing transistor 702 is carried out. The low-pass filter is formed by resistor 704 of value R3 and by capacitor 705 of value C3. The following notations are used: VGS3 for the voltage between gate G3 and source S3 of transistor 701, and VGS4 for the voltage between gate G4 and source S4 of transistor 702.

The difference with the embodiment of FIG. 5 is that when a negative disturbance occurs, the disturbance is now followed by the gate of the current mirror rather than by the source, which is then common. Indeed, when the potential of node 708 decreases, the decrease is propagated onto the gate of transistor 701 and thus on that of transistor 702.

On the side of the source of transistor 701, if the frequency of the disturbance is smaller than $1/(2\pi R3C3)$, the potential decrease of node 708 is propagated onto the source of transistor 702. This induces no change in voltage VGS4 since the potentials of gate G4 and of source S4 of transistor 702 have varied by the same order of magnitude.

However, if the frequency of the disturbance is greater than $1/(2\pi R3C3)$, then the decrease of the potential of node 708 is propagated onto the source of transistor 702 with a level shifting due to the action of the low-pass filter. From the moment that the amplitude of the disturbance exceeds the product of the value of resistor 703 and of the quiescent current flowing through transistor 702, voltage VGS4 increases in absolute value. An additional current then appears in transistor 702, which induces the state switching of the output OUT, which may be interpreted as a logic state switching. A circuit detecting so-called negative power supply disturbances has thus been formed.

The variations described for the embodiment of FIG. 5 may be applied to the embodiment of FIG. 7. Another embodiment comprises combining the negative and positive power supply disturbance detection circuits in a same circuit.

Figure 8:
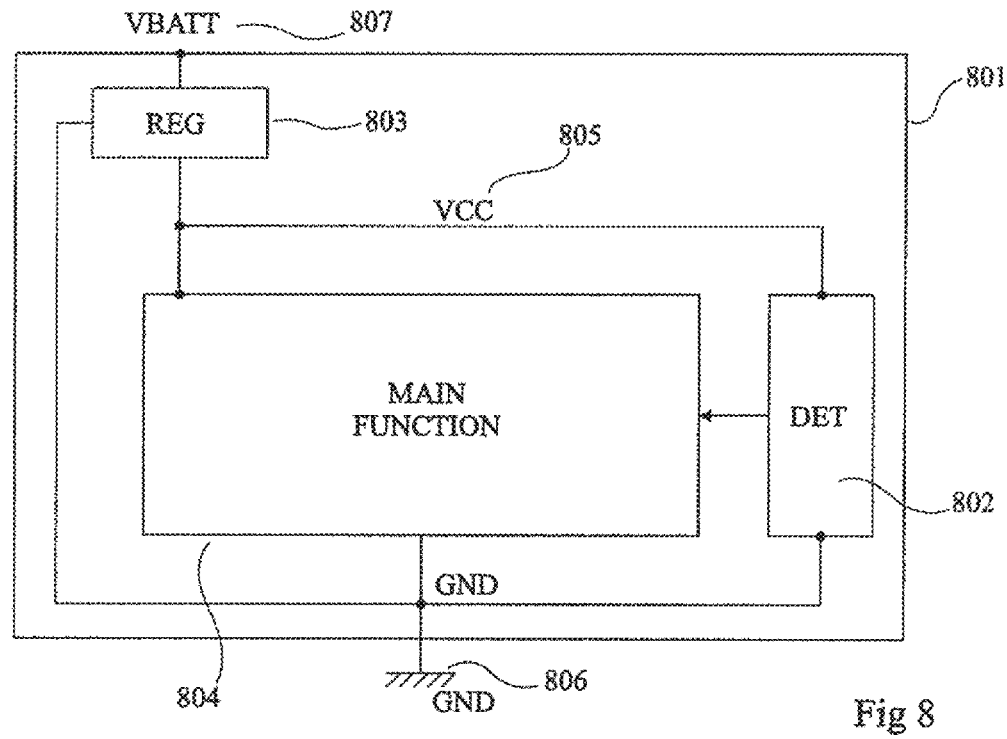
FIG. 8 shows an embodiment of a device integrating a detector of power supply disturbances.

FIG. 8 shows an embodiment of a device integrating a detector of positive and/or negative power supply disturbances. Device 801 comprises a voltage regulator 803 (REG) coupled between a terminal of application of a power supply voltage 807 and a ground terminal 806 (GND). Regulator 803 generates a power supply voltage 805 (VCC) from a voltage applied to power supply application terminal 807 (VBATT). The device further comprises a main circuit (MAIN FUNCTION) 804 and a power supply disturbance detector 802 (DET), coupled between power supply voltage 805 and ground 806. Disturbance detector 802 and circuit 804 are interconnected.

When an attack by disturbance of the power supply is carried out on power supply application terminal 807, if the disturbance is sufficiently significant to be propagated through regulator 803, it ends up on power supply voltage 805. If the amplitude of the disturbance is above the detection threshold and above the disturbance frequency such as defined in the embodiments of FIGS. 5 and 7, then detector 802 detects a disturbance. Due to the connection between detector 802 and main circuit 804, a sequence of tasks then follows, where the tasks may be the sending of a signal indicating to the main circuit that an attack is being conducted, the setting to stand-by of the main circuit, or any other action.

Figure 9:
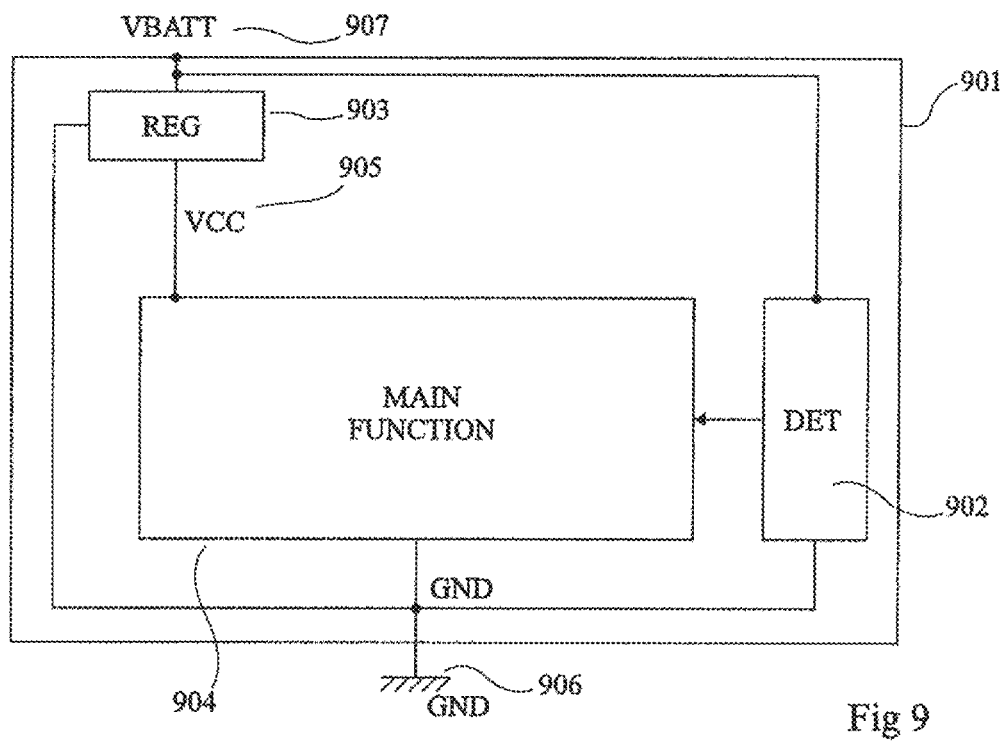
FIG. 9 shows another embodiment of a device integrating a detector of power supply disturbances.

FIG. 9 shows another embodiment of a device integrating a power supply disturbance detector. Device 901 comprises a voltage regulator 903 (REG) coupled between a terminal of application of a power supply potential 907 and a ground terminal 906. Regulator 903 generates a power supply voltage 905 (VCC) from a voltage applied to the terminal of application of power supply potential 907 (VBATT). The device further comprises a main circuit (MAIN FUNCTION) 904 coupled between power supply voltage 905 and ground 906, as well as a disturbance detector (DET) coupled between the terminal of application of a power supply potential and the ground terminal. Disturbance detector 902 and circuit 904 are interconnected. The difference with the embodiment described in FIG. 8 is that the power supply disturbance detection is performed directly at the level of the terminal of application of the power supply potential.

Other embodiments of devices may combine the integration of different power supply disturbance detectors, coupled to different internal power supply voltages and/or different terminal s of application of power supply potentials of the devices. Other variations of the described embodiments are possible to detect positive and/or negative power supply disturbances on devices coupled between a terminal of application of a negative power supply potential and a ground terminal, or between a terminal of application of a positive power supply potential and a terminal of application of a negative power supply potential.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A detection circuit, comprising:
a current mirror comprising a first transistor and a second transistor, wherein a gate terminal of the first transistor, a drain terminal of the first transistor, and a gate terminal of the second transistor are coupled as a first node, wherein a source terminal of the first transistor and a power supply terminal are coupled as a second node, and wherein the power supply terminal is configured to receive a first power supply voltage;
a first current source comprising a first terminal and a second terminal, wherein the first terminal of the first current source is coupled to the drain terminal of the first transistor, and wherein the second terminal of the first current source is coupled to a ground potential;
a second current source coupled between a drain terminal of the second transistor and the ground potential, wherein an output voltage of the detection circuit, drawn from a third node located between the drain terminal of the second transistor and the second current source, is configured to vary in response to a variation of the first power supply voltage at the power supply terminal;
a first resistor coupled between a source terminal of the second transistor and a fourth node;
a second resistor coupled between the fourth node and the second node; and
a first capacitive element coupled between the fourth node and the ground potential.

2. The detection circuit of claim 1, wherein the second resistor is configured to set a threshold of detection of the variation of the first power supply voltage at the power supply terminal.

3. The detection circuit of claim 2, wherein a reference current common to the first current source and the second current source is obtained by a ratio of a temperature-independent voltage to a resistance of the second resistor.

4. The detection circuit of claim 3, wherein the threshold of detection of the variation of the first power supply voltage at the power supply terminal is independent of a temperature variation.

5. The detection circuit of claim 1, wherein the first transistor and the second transistor comprise MOS transistor s, and wherein a ratio of a width of a gate of the first transistor to a length of the gate of the first transistor is different from a ratio of a width of a gate of the second transistor to a length of the gate of the second transistor.

6. The detection circuit of claim 1, wherein the first current source and the second current source comprise MOS transistor s, and wherein a ratio of a width of a gate of the first current source to a length of the gate of the first current source is different from a ratio of a width of a gate of the second current source to a length of the gate of the second current source.

7. The detection circuit of claim 1, wherein the first transistor and the second transistor comprise bipolar transistor s.

8. The detection circuit of claim 1, wherein the first current source comprises a current transistor.

9. The detection circuit of claim 1, wherein the second resistor comprises a programmable resistor.

10. The detection circuit of claim 1, wherein the first power supply voltage comprises a voltage upstream of a voltage regulator configured to generate a second power supply voltage from the first power supply voltage.

11. The detection circuit of claim 1, wherein the first power supply voltage comprises a voltage downstream of a voltage regulator configured to generate the first power supply voltage from a second power supply voltage.

12. The detection circuit of claim 1, wherein the detection circuit is configured to detect an unauthorized access to an integrated chip card based on the variation of the first power supply voltage at the power supply terminal.

13. A device, comprising:
a power supply regulator coupled between a terminal of application of a first power supply voltage and a ground potential, wherein the power supply regulator is configured to generate a second power supply voltage from the first power supply voltage;
a main circuit comprising a first terminal coupled to the power supply regulator and configured to receive the second power supply voltage, the main circuit further comprising a second terminal coupled to the ground potential; and
a detection circuit configured to provide the main circuit an indication signal indicative of a disturbance in the first power supply voltage or in the second power supply voltage, the detection circuit comprising:
a current mirror comprising a first transistor and a second transistor, wherein a gate terminal of the first transistor, a drain terminal of the first transistor, and a gate terminal of the second transistor are coupled as a first node, wherein a source terminal of the first transistor and a power supply terminal are coupled as a second node, and wherein the power supply terminal is configured to receive the first power supply voltage or the second power supply voltage;
a first current source comprising a first terminal and a second terminal, wherein the first terminal of the first current source is coupled to the drain terminal of the first transistor, and wherein the second terminal of the first current source is coupled to the ground potential;
a second current source coupled between a drain terminal of the second transistor and the ground potential, wherein an output voltage of the detection circuit, drawn from a third node located between the drain terminal of the second transistor and the second current source, is configured to vary in response to the disturbance in the first power supply voltage or in the second power supply voltage;
a first resistor coupled between a source terminal of the second transistor and a fourth node;
a second resistor coupled between the fourth node and the second node; and
a first capacitive element coupled between the fourth node and the ground potential.

14. The device of claim 13, wherein the indication signal is generated based on the output voltage of the detection circuit.

15. The device of claim 13, wherein the main circuit comprises an integrated circuit card.

16. The device of claim 15, wherein the detection circuit is configured to detect an unauthorized access to an integrated chip card based on the disturbance in the first power supply voltage or in the second power supply voltage.

17. The device of claim 16, wherein the indication signal is configured to cause the integrated chip card to shut down in response to a detection of the unauthorized access to the integrated chip card.

18. The device of claim 13, wherein the second resistor is configured to set a threshold of detection of the disturbance in the first power supply voltage or in the second power supply voltage.

19. The device of claim 18, wherein a reference current common to the first current source and the second current source is obtained by a ratio of a temperature-independent voltage to a resistance of the second resistor.

20. The device of claim 19, wherein the threshold of detection of the disturbance in the first power supply voltage or in the second power supply voltage is independent of a temperature variation.

21. The device of claim 13, wherein the first transistor and the second transistor comprise MOS transistor s.

22. The device of claim 21, wherein a ratio of a width of a gate of the first transistor to a length of the gate of the first transistor is different from a ratio of a width of a gate of the second transistor to a length of the gate of the second transistor.

23. The device of claim 13, wherein the first current source and the second current source comprise MOS transistor s, and wherein a ratio of a width of a gate of the first current source to a length of the gate of the first current source is different from a ratio of a width of a gate of the second current source to a length of the gate of the second current source.

* * * * *